United States Patent
Uner et al.

(10) Patent No.: US 6,551,860 B2
(45) Date of Patent: Apr. 22, 2003

(54) SYSTEMS AND METHODS FOR APPLICATION OF SUBSTANTIALLY DRY ATMOSPHERIC PLASMA SURFACE TREATMENT TO VARIOUS ELECTRONIC COMPONENT PACKAGING AND ASSEMBLY METHODS

(75) Inventors: Jason R. Uner, Chicago, IL (US); Thierry Sindzingre, Cachan (FR); Claude Carsac, Limours (FR)

(73) Assignees: L'Air Liquide - Societe Anonyme a'Directoire et Conseil de Surveillance pour l'Etude et l'Exploitation des Procedes Georges Claude, Paris (FR); American Air Liquide, Fremont, CA (US)

( * ) Notice: Subject to any disclaimer, the term of this patent is extended or adjusted under 35 U.S.C. 154(b) by 0 days.

(21) Appl. No.: 10/054,336

(22) Filed: Jan. 22, 2002

(65) Prior Publication Data

US 2002/0060380 A1 May 23, 2002

Related U.S. Application Data

(62) Division of application No. 09/816,842, filed on Mar. 23, 2001, now Pat. No. 6,468,833.
(60) Provisional application No. 60/193,869, filed on Mar. 31, 2000.

(51) Int. Cl.[7] .......................... H01L 21/44; H01L 21/48; H01L 21/50
(52) U.S. Cl. ....................... 438/115; 438/710; 438/720; 438/906; 134/1; 134/1.1; 134/1.2; 134/1.3; 134/172; 134/198; 134/902; 510/175
(58) Field of Search ................................. 438/115, 710, 438/720, 906; 134/1, 1.1, 1.2, 1.3, 172, 198, 902; 510/175

(56) References Cited

U.S. PATENT DOCUMENTS

| | | | | |
|---|---|---|---|---|
| 5,192,582 A | * | 3/1993 | Liedke et al. | 228/206 |
| 5,433,820 A | * | 7/1995 | Sindzingre et al. | 216/13 |
| 5,492,265 A | * | 2/1996 | Wandke | 228/205 |
| 5,518,964 A | * | 5/1996 | DiStefano et al. | 436/113 |
| 5,722,581 A | * | 3/1998 | Sindzingre et al. | 228/206 |
| 5,830,782 A | * | 11/1998 | Smith et al. | 438/123 |
| 5,852,326 A | * | 12/1998 | Khandros et al. | 257/692 |
| 5,858,312 A | * | 1/1999 | Sindzingre et al. | 422/186.04 |
| 5,887,610 A | * | 3/1999 | Verbockhaven | 137/3 |
| 5,915,752 A | * | 6/1999 | DiStefano et al. | 29/827 |
| 5,941,448 A | * | 8/1999 | Sindzingre et al. | 228/206 |
| 6,021,940 A | * | 2/2000 | Sindzingre et al. | 228/203 |
| 6,074,203 A | * | 6/2000 | Leturmy et al. | 432/47 |
| 6,089,445 A | * | 7/2000 | Sindzingre et al. | 228/218 |
| 6,146,503 A | * | 11/2000 | Sindzingre et al. | 204/164 |
| 6,468,833 B2 | * | 10/2002 | Uner et al. | 438/115 |

* cited by examiner

Primary Examiner—Albert W. Paladini
Assistant Examiner—David A. Zarneke
(74) Attorney, Agent, or Firm—Linda K. Russell (57) ABSTRACT

This invention is related to a method for encapsulating bond regions in electronic components comprising, for example, metallic bond regions, the method comprising the steps of exposing an electronic component having at least one bond region through a primary gas atmosphere comprising unstable or excited gaseous species, the gaseous species being substantially devoid of any electrical charges, the primary gas atmosphere having a pressure ranging from about $0.5 \times 10^5$ Pa to about $3.0 \times 10^5$ Pa, thereby forming a treated, non-encapulated electronic component, then encapsulating the electronic component.

15 Claims, 6 Drawing Sheets

FIG. 15

SYSTEMS AND METHODS FOR APPLICATION OF SUBSTANTIALLY DRY ATMOSPHERIC PLASMA SURFACE TREATMENT TO VARIOUS ELECTRONIC COMPONENT PACKAGING AND ASSEMBLY METHODS

This application is a divisional of application Ser. No. 09/816,842 filed Mar. 23, 2001, now U.S. Pat. No. 6,468,833.

CROSS-REFERENCE TO RELATED APPLICATIONS

This application claims the benefit under 35 U.S.C. §119(e) to provisional application No. 60/193,869, filed Mar. 31, 2000, the entire contents of which are incorporated herein by reference.

BACKGROUND OF THE INVENTION

1. Brief Description of the Invention

The present invention relates to methods and systems for generating substantially dry atmospheric plasma which effectively can remove metal oxides, moisture and other undesirable compounds from metal and other surfaces just prior to packaging of electronic components.

2. Related Art

Preventing the failure of some integrated circuit (IC) packages due to the trapping of moisture or oxides between the package material, whether epoxy, BT Resin, polyamide, metal, or other material, and the IC. In addition, creating a clean activated surface in order to enhance the adhesion, wetability, flow, or bonding properties of the adhesive, molding compound, or metal bonding application. When any of these problems are not solved, the package can 'popcorn' or crack during the application of reflow soldering which is done at high temperature (>180C) or experience general problems in reliability for bonding. In addition, there also may be some benefit from treatment of the entire IC, leadframe, etc. prior to encapsulation. This can help activate the surface and remove any oxide, $H_2O$, or other reducible compounds. This can prevent adhesion problems and encourage consistent spreading of the encapsulant material. Lastly, the advent of lead-free technology will also force this temperature to be higher during reflow and thus increase even further the stringent requirements to make a good package that won't crack or fail.

SUMMARY OF THE INVENTION

By following a prescribed format for the use of a plasma system, treatment of the surfaces involved in the die attach processes can be improved. The basic steps involved are: complete deoxidization and treatment of a surface by use of a plasma process, including the activation of the surface while removing $H_2O$ and other reducible compounds prior to application of the glue, solder, or adhesion material to the surface whether plastic, metal, or other material. This is then followed by application of the glue, solder, or other material and subsequent bonding of the IC or package to the package or PCB respectively. In addition, the entire IC and lead frame structure can be treated prior to encapsulation in order to activate the surfaces and to remove oxides, $H_2O$, or other reducible compounds. Exposure to the plasma just prior to the encapsulation step will remove impurities and improve wetability and flow as well as prevent delamination. Lastly, before making any metal to metal bonds, as in wire bonding for example, the plasma can be used to treat the surfaces in order to remove oxides, organic impurities, or other reducible material just prior to bonding. The advent of copper wire bonding will make this step more important so as to improve bond strength.

In accordance with the present invention systems and methods for forming an atmospheric, low temperature plasma greatly improves the IC packaging process by cleaning surfaces prior to encapsulation. This allows for strong plastic to metal and strong plastic to semiconductor material bonds to be formed and, when preferred, for successful copper to copper bond formation.

One aspect of the invention is a system for effecting bond region modification in electronic components comprising encapsulant materials, the system comprising: (a) a sub-system in which one or more electronic components are adapted to have an encapsulant applied and bonded thereto; (b) a source of initial gas; and (c) an electrical discharge apparatus connected to said source of initial gas for producing a primary gas from said initial gas, the primary gas comprising a plurality of unstable or excited species, the primary gas adapted to contact at least a portion of encapsulant bond regions of the electrical components in the sub-system and thereby effect encapsulant bond region modification prior to encapsulation.

Preferred are systems wherein the source of initial gas comprises a source of an inert gas, a reducing gas, and/or an oxidizing gas. Preferably, the initial gas has less than 1% water vapor, more preferably less than 500 ppm water vapor, and more preferably less than 50 ppm water vapor, and even more preferably less than 1 ppb water vapor. This limitation on the amount of water vapor in the initial gas helps to reduce, preferably eliminate, the tendency of the primary has to include species that might recombine to form water vapor after exposing the electronic component to primary gas.

Particularly preferred are those systems in accordance with the invention comprising means to maintain the primary gas mixture at a pressure ranging from about $0.1 \times 10^5$ Pa to about $3.0 \times 10^5$ Pa. Other preferred systems in accordance with the first aspect of the invention are those which include at least two electrical discharge apparatus, preferably in series relationship, wherein the apparatus employ same or different initial gas.

Also preferred are systems in accordance with the first aspect of the invention wherein two of the electrical discharge apparatus are in parallel, and either the same or different initial gas is employed. When two or more electrical discharge apparatus are employed, the apparatus may be same or different, and may use same or different power levels.

Other preferred systems in accordance with the first aspect are those which include a hood which encloses the conveying sub-system and primary gas, in preferably airtight fashion.

A second aspect of the invention is a system for encapsulating one or more bonded metallic bond regions of a first electronic component bonded to one or more metallic bond regions of a second electronic component to form one or more metallic bonded regions, the system comprising: (a) a conveying sub-system upon which one or more metallically bonded, non-encapsulated electronic components travel from a metallic bonding station, electronic components having at least one metallic bond region; (b) a source of initial gas; (c) an electrical discharge apparatus for producing a primary gas from said initial gas, the primary gas comprising a plurality of unstable or excited species, the primary gas adapted to contact at least some of the regions of the electrical components adapted to be encapsulated end thereby effect encapsulant bond region modification; (d) an encapsulation station downstream of the bonding station, wherein the metallic bonded, non-encapsulated electrical components are encapsulated. Preferred systems in accordance with this aspect of the invention are systems wherein the encapsulation system is connected to the inerting station so as to avoid as much as possible the chance of moisture (water vapor and moisture are used interchangeably herein) adhering to or otherwise becoming a component of the non-encapsulated electronic component prior to encapsulation. Also preferred are systems in accordance with this aspect further comprising an annealing station connected to the bonding station and down stream of the bonding station.

Preferred are systems in accordance with this aspect wherein the electrical discharge apparatus comprises means to maintain the primary gas at a pressure ranging from about $0.1\times10^5$ Pa to about $3.0\times10^5$ Pa, such as a hood or tunnel, preferably air-tight. Preferred are systems comprising sources of inert, reducing, and oxidizing gases to make an initial gas mixture having at most 1% water vapor, preferably less than 500 ppm water vapor, more preferably less than 50 ppm water vapor, and even more preferably less than 1 ppb water vapor (volume basis).

Particularly preferred are those system embodiments of the first and second aspects of the invention equipped to de-oxide copper-containing metals and "pure" copper metal connections, as further discussed herein.

A third aspect of the invention is a method for encapsulating at least some metallic bonded regions in electronic components comprising metallic bonded regions, the method comprising transporting an electronic component having at least one metallic bonded region through a primary gas atmosphere comprising unstable or excited gaseous species, the gaseous species being substantially devoid of any electrical charges, the primary gas atmosphere having a pressure ranging from about $0.5\times10^5$ Pa to about $3.0\times10^5$ Pa, thereby forming a treated, bonded, non-encapsulated electronic component, and thereafter encapsulating at least some of the metallic bonded regions with an encapsulant material. Preferably, the primary gas is produced from an initial gas mixture comprising less than 1% water vapor, preferably less than 500 ppm water vapor, more preferably less than 50 ppm water vapor, and even more preferably less than 1 ppb water vapor. In one preferred method in accordance with the invention the initial gas comprises an inert gas and an oxidizing gas other than water vapor. In another method embodiment, the initial gas comprises a reducing gas and an oxidizing gas other than water vapor.

When used, the inert gas is selected from the group consisting of $N_2$, Ar, He, Ne, Xe, Kr, and mixtures thereof; the reducing gas is selected from the group consisting of $H_2$, $CH_4$, $NH_3$, and mixtures thereof; and the oxidizing gas is selected from the group consisting of $O_2$, $CO_2$, $N_2O$, CO, NO, and mixtures thereof.

It is preferred that the primary gas is produced by flowing the initial gas through an electrical discharge apparatus as taught in U.S. Pat. Nos. 5,941,448 and 5,722,581, incorporated herein by reference. As disclosed in these patents, electrical discharge apparatus comprises first and second electrodes, a layer of dielectric material arranged on a surface of at least one of the first and second electrodes; the dielectric material faces one of the first and second electrodes, and the initial gas passes substantially transversely to the first and second electrodes.

Preferred electrical discharge apparatus operate at a power greater than or equal to 1 $W/cm^2$, more preferably at a power greater than or equal to 10 $W/cm^2$, and even more preferably at a power ranging from about 10 $W/cm^2$ to about 100 $W/cm^2$. All power values are normalized per unit surface area of the dielectric material.

The electronic component treated by the methods of the invention is preferably selected from the group consisting of an IC, a package into which an IC is to be placed, a package containing an IC and having terminals, a printed circuit board, a socket component for test and burn-in, a surface mount device, or combinations thereof.

Also preferred are methods in accordance with this aspect of the invention further comprising a step of transporting the treated electronic component to a packaging machine. Further preferred are methods in accordance with this aspect wherein the transporting is carried out in a substantially inert atmosphere.

A fourth aspect of the invention is a method of assembling an encapsulated electronic device, the encapsulated electronic device comprising at least one metallic bond between at least two previously unconnected metallic bonding regions, the method comprising the steps of:

(a) aligning, but not contacting a first component having a first metallic bonding region with a second component having a second metallic bonding region;

(b) exposing at least one of the first and second metallic bonding regions to a first primary gas, the first primary gas having a pressure ranging from about $0.1\times10^5$ Pa to about $3.0\times10^5$ Pa and comprising unstable or excited species and substantially devoid of electrical charges;

(c) contacting the first and second metallic bonding regions under conditions sufficient to form a metallurgical bond between the first and second metallic bonding regions thus forming a metallic bonded non-encapsulated electronic device;

(d) exposing at least a portion of the metallic bonded non-encapsulated electronic device to a second primary gas to form a metallic bonded, plasma treated non-encapsulated electronic device, the second primary gas having a pressure ranging from about $0.1\times10^5$ Pa to about $3.0\times10^5$ Pa and comprising unstable or excited species and substantially devoid of electrical charges; and (e) encapsulating at least a portion of the metallic bonded, plasma treated non-encapsulated device.

Preferred are those methods in accordance with the fourth aspect wherein step (c) comprises a process selected from the group consisting of thermosonic bonding, ultrasonic bonding, compression bonding, wire bonding, solder bump bonding, or a combination of same; methods wherein step (a) comprises the use of a flexible dielectric interposer sheet; methods wherein both metallic bonding regions are exposed to the primary gas prior to step (c); methods wherein step (b) comprises generating the primary gas by passing an initial gas mixture through an electrical discharge apparatus; methods wherein step (b) comprises focusing a flowing stream of primary gas over the metallic bonding regions; methods wherein the first component is a dielectric interposer sheet having an area array of elongated, strip-like leads, and the second component is selected from the group consisting of a second dielectric sheet or a semiconductor wafer; methods wherein the first component is an integrated circuit chip and the second component is a TAB tape having one or more metallic leads thereon; and methods wherein the first component is a connection component having one or more leads having a frangible section, and the second component is a semiconductor chip.

A preferred atmospheric plasma process and system for use in the invention is the system designed by Air Liquide known under the trade designation ALIXSTAR, which effectively can remove metal oxides and other undesirable compounds from metal surfaces, and is one preferred system used just prior to packaging an IC in order to provide a clean surface on the metal bond sites of the IC and the package for metal to metal bonding. The treatment process of the invention also can achieve these results at atmospheric pressure which is something not currently available within the industry. The use of a method for treating metal surfaces just prior to bonding is becoming more important as copper to copper interconnect technology becomes the standard.

Further preferred embodiments and aspects will become apparent after review of the following description and claims.

DESCRIPTION OF PREFERRED EMBODIMENTS

The Air Liquide system known under the trade designation "ALIX STAR" is a preferred electrical discharge apparatus for generating an atmospheric plasma. It is, when used with the appropriate initial gas, capable of treating metal and other surfaces such as plastic and semconductor materials with primary gas with the purpose of removing oxides, moisture and other compounds that are present on the surfaces of electronic components. The result allows for clean, substantially moisture-free surfaces that can be bonded very effectively to other surfaces using appropriate bonding techniques. The electrical discharge apparatus is described in U.S Pat. Nos. 5,722,581, and 5,941,448, previously incorporated by reference herein.

The methods for performing the treatment of the invention are characterized in general by:

(a) passing an initial gas mixture, comprising an inert gas and/or a reducing gas and including an oxidizing gas mixture which includes less than 1% water vapor, through at least one electrical discharge apparatus for formation of excited or unstable gas species, in order to obtain a primary gas mixture at the outlet of the apparatus;

(b) exposing at least some, preferably all surfaces of electronic components at a pressure close to atmospheric pressure, with the primary gaseous atmosphere. comprising excited or unstable gas species and substantially free of electrically charged species.

The surface includes any surface'that will be contacted by an encapsulant material. The surface may therefore be, for example, any surface, preferably metallic, which may be involved in a bonding operation for assembling, testing or packaging, whether, for example, made of copper, gold, aluminum, nickel, tin, lead, tin/lead, tin/lead/silver, or other alloys, metals, or combinations of metals. The surface may include either the substrate, an IC, or a plastic or elastomeric interposer between any two conductive surfaces, where the idea is to bond the electrical links of one article to a second article, preferably an IC to its specified package. The surface includes any surface that will be contacted by an encapsulant material, whether that surface is involved in electrical links or not.

According to the invention, the term "pressure close to atmospheric pressure" is intended to mean a pressure advantageously ranging from about $0.1 \times 10^5$ Pa to about $3 \times 10^5$ Pa, more preferably from about $0.5 \times 10^5$ Pa to about $1.5 \times 10^5$ Pa.

According to the invention, the term "electrically charged species" is intended to mean ions or electrons. The primary gas treatment atmosphere according to the invention is therefore distinguished from a known plasma atmosphere in that it is substantially free of electrically charged species, that is to say ions or electrons.

The inert gas may, for example, be selected from the group consisting of nitrogen, argon, helium, krypton, neon, xenon, or a mixture of such inert gases. The reducing gas may, for example, be selected from hydrogen, methane, or ammonia or a mixture of like reducing gases.

The oxidizing gas mixture may, for example, comprise oxygen, $CO_2$, or $N_2O$, or a mixture of such gases.

The list of gases given in each category being, of course, only an indication and in no way limiting.

The apparatus according to the invention consists of any device making it possible to "excite" an initial gas mixture in order to obtain, after conversion in the apparatus, and at the gas outlet of the apparatus, another gas mixture (referred to as the primary gas mixture) comprising unstable and/or excited species, the latter gas mixture being substantially free of electrically charged species. Such excitation is preferably obtained by electrical discharge, for example, of the corona discharge type.

As will be clearly apparent to the person skilled in the art on reading the present description, the water vapor content of the initial gas mixture should be adapted in each case, in particular to the content of the rest of the initial gas mixture (for example its reducing gas, for example hydrogen, content), and also to the type of article to be treated, so that the initial gas mixture comprises no more than 1% water vapor, preferably no more than 500 ppm water vapor, more preferably no more than 50 ppm water vapor, and even more preferably no more than 1 ppb water vapor.

The oxygen content of the initial gas mixture is preferably kept less than a few hundred of ppm.

It is preferred not only to avoid water vapor in the initial and primary gas mixtures, but to avoid the presence of species that could produce water vapor. Therefore, if oxygen, a gaseous mixture comprising oxygen, or an oxidizing gas having one or more oxygen atoms in its structure is employed, then hydrogen, gaseous mixtures comprising hydrogen, and gases having one or more hydrogen atoms in their structure (for example SiH4) are avoided. Similarly, if hydrogen, gaseous mixtures comprising hydrogen, and gases having one or more hydrogen atoms in their structure are employed, then oxygen, gaseous mixtures comprising oxygen, and oxidizing gases having one or more oxygen atoms in its structure are avoided.

The methods according to the invention make it possible to carry out the treatment with the aid of a primary gas mixture obtained at a gas outlet of a single apparatus, or of a plurality of apparatus placed in parallel over the area of the article or articles to be treated, or successively with the aid of some or different primary gas mixtures obtained at gas outlets of a plurality of apparatus placed in series in order to achieve the appropriate coverage.

Similarly, as will be clearly apparent to the person skilled in the art, methods according to the invention are applicable, according to the requirements expressed by the user, both to the treatment of a single and multiple faces of the article to be treated and to the case in which it is desired to treat one or more articles prior to bonding them together and prior to encapsulation.

According to one aspect of the invention, the article having the surface or surfaces to be treated can be brought in front of a single primary gas outlet of the apparatus or, if appropriate, in front of primary gas outlets of a plurality of apparatus placed in parallel over the width of the article. The article can be moved by use of a conveyor system or a stepper which, if appropriate, can pass through an internal space which is bounded by a covering structure (for example a tunnel or a set of elementary coverings) and is isolated from the surrounding atmosphere, the structure being either: connected in a leak-tight manner to the electrical discharge apparatus, including the electrical discharge apparatus, or arranged in such a manner so as to effectively and efficiently treat the surface properly.

When the article having the metallic surface or surfaces to be treated is brought in front of the primary gas outlets of a plurality of apparatus placed in parallel over the width of the article and/or successively in front of primary gas outlets of a plurality of apparatus placed in series, at least one of these apparatus converts an initial gas mixture into a primary gas. The initial gas mixture converted in the other apparatus may then comprise an inert gas and/or a reducing gas and/or an oxidizing gas.

According to one preferred embodiment of the invention, the apparatus (or at least one apparatus) in which an initial gas mixture is converted to primary gas is the site of an electrical discharge created between a first electrode and a second electrode, a layer of a dielectric material being arranged on the surface of at least one of the electrodes, facing the other electrode, with the initial gas mixture passing through the discharge transversely to the electrodes.

The power used in the apparatus, normalized per unit surface area of dielectric, will advantageously be greater than or equal to 1 W/cm$^2$, preferably greater than or equal to 10 W/cm$^2$, and most preferably ranging from about 10W/cm$^2$ to about 100 W/cm$^2$.

According to one of the embodiments of the invention, the treatment atmosphere successively encountered by the article to be treated along the conveyor is zoned in the following manner:

(a) at least one of the apparatuses for forming excited or unstable gas species converts a different initial gas mixture from that converted by the apparatus preceding it in the said structure, and/or (b) an adjacent gas mixture (which has not passed through the apparatus) employed in at least one of the apparatuses for forming excited or unstable gas species is different from that employed in the apparatus preceding it in the said structure.

According to one preferred embodiment of the invention, steps (a) and (b) above may relate to one and the same apparatus.

It will thus, for example, be possible to use initial gas mixtures having a reducing power which increases from one apparatus to another.

Upon completion of the treatment step, the article is then preferably moved by means of a stepper, conveyor belt, or other method to the entrance of a machine in which the packaging operation is to be carried out. The article being, if appropriate, kept under a protective atmosphere between the exit of the structure and the entry of the machine. The term "protective atmosphere" is in this case intended to mean an essentially inert atmosphere in which the residual oxygen concentration does not exceed a few hundred of ppm, more preferably does not exceed 100 ppm.

According to another aspect of the invention, the bonding or packaging operation is carried out within an appropriate time after treatment and within the environment supplied by the bonding or packaging tool.

Another application of the invention would be to incorporate an electrical discharge apparatus and gas supply conduits into a known packaging procedure. For example, in a typical process using thermosonic, ultrasonic, or compression bonding as the means for bonding (as described in U.S. Pat. No. 5,830,782 incorporated by reference herein) a plurality of leads on an IC are connected to a plurality of metallic pads on the assembly, typically called an area array. The assembly itself can be, but is not restricted to, a flexible interposer, a rigid substrate, or a lead frame. The treatment can be applied to an individual IC, a group of IC's, or to an entire wafer.

As explained in the '782 patent, in a procedure using a flexible interposer, the assembly article is precisely aligned with the wafer so that each connection component constituting the assembly article is precisely aligned with the corresponding chip. The bond region or tip end of each lead is aligned with the correct contact on the wafer. This precise alignment can be achieved even over a relatively large assembly article incorporating numerous connection components, covering essentially the entire wafer. Even over this large area, however, the tip ends of the leads must be aligned with the contacts with the required precision.

While the component and chip are maintained in precise alignment, platens are moved toward one another to juxtapose the assembly article, and hence the connection components, closely with the wafer. At this point, the atmospheric plasma treatment preferably occurs, flowing primary gas over the metal contacts and all surfaces of the wafer and the polymer or other material containing the metal circuits used for the package in order to remove any metal oxides or other reducible compounds present on the metal leads. The length and flow rate of the treatment may vary with each specific process.

Upon completion of the surface treatment, the interposer sheet can continue to be lowered downwardly towards the wafer so that the bonding material at the tip end or bond region of each lead is engaged with the aligned contact, thus achieving intimate contact between the bonding material at the tip ends of the leads, over the entire surface of the wafer, despite any non-planarity of the assembly article or of the wafer, without applying undesirably high localized stress at any point.

Lastly, while contact is maintained, the assembly is heated to a temperature sufficient to activate the bonding material in spots, and form metallurgical bonds between the bond regions of the leads and the contacts of the wafer. In this example, the heating process brings the assembly to a temperature of about 240° C. for about 150 seconds. The tin or copper within each spot interdiffuses with the surrounding gold or copper in the contacts and in the lead itself, forming a liquid layer. This layer in turn continues to dissolve gold or copper from the contacts and from the leads. At this point, the bond solidifies. The bonding process can continue with an annealing step at a temperature sufficient to permit substantial interdiffusion between gold and tin or to strengthen the copper to copper bond if necessary. For gold and tin the annealing is typically done at about 180° C. for about 10 minutes, so as to further enrich the bond with gold and further strengthen the bond. During this entire process, the tip ends of the leads remain connected to the lower surface of the dielectric interposer sheet by buttons. Thus, the tip ends cannot move out of position during the bonding process and a reliable metal to metal bond is formed.

Another application of the invention is to expose wires and surfaces used in wire bonding to the primary gas just prior to bonding. In wire bonding, described briefly in the background section of U.S. Pat. No. 5,852,326, incorporated herein by reference, the substrate has a top surface with a plurality of electrically conductive contact pads or lands disposed in a ring-like pattern. The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine metallic wires are connected between the contacts on the front face of the chip and the contact pads on the top surface of the substrate. These wires extend outwardly from the chip to the surrounding contact pads on the substrate. The surfaces of both the IC and the substrate could be continually treated, as is done by the use of nitrogen currently, as the wire bond process occurs or just prior to the bonding. This would result in better metal to metal bonds, especially involving copper, and possibly the elimination of other pretreatment steps.

Yet another application of the plasma surface treatment is to the bonding of leads using a bonding tool or TAB style package as described in U.S. Pat. No. 5,915,752, incorporated by reference herein. In this process, a bonding tool and the respective contact on the chip are placed in alignment. At this point, prior to, or throughout the process, surface treatment can occur by use of a primary gas stream directed onto the two surfaces about to be bonded. This will clean the surfaces prior to bonding and allow for an improved metal to metal bond. Next, the tool is advanced downwardly so as to force the connection section of the most closely aligned lead downwardly. As the tool moves downwardly under the influence of forces applied by the bonding apparatus, it displaces the connection section downwardly relative to the support structure of the connection component. As the second end of the connection section is forced downwardly, a frangible section breaks, thereby freeing the second end from the securement element and detaching the same from the support structure. The first end of each such connection section bends downwardly so that the freed connection section can be forced into engagement with the aligned contact by the tool. At the time the second end of each connection section is detached from the support structure, it is already engaged with the groove of the tool. As the tool forces the connection section into engagement with the contact, heat and/or ultrasonic vibrations may be applied by the bonding apparatus through the tool so as to cause the connection section to bond to the contact: The lower surface of coupling section bears on the connection section of each lead to force it against the contact.

Other applications of the teachings of the present invention within the area of electronics packaging, assembly and testing are possible. The primary gas stream can be sized, projected, or focused in various ways to treat surfaces as small as a few leads to an entire wafer. In addition, the treatment can apply to other surfaces such as that of a wafer, a polymer tape, or any packaging material used. The exact application and use will depend upon the technique involved in the packaging process. Additionally, use of the plasma treatment may possibly eliminate some or all of the known and presently used pre-treatment steps. Essentially, any situation that involves making a metal to metal bond is one where surface treatment according to the invention can improve the results achieved. This will become especially important when fewer solders and anti-oxidants are used in electronics packaging, and pure metals, such as copper, become the best way to connect the leads of the IC.

Figure 1:
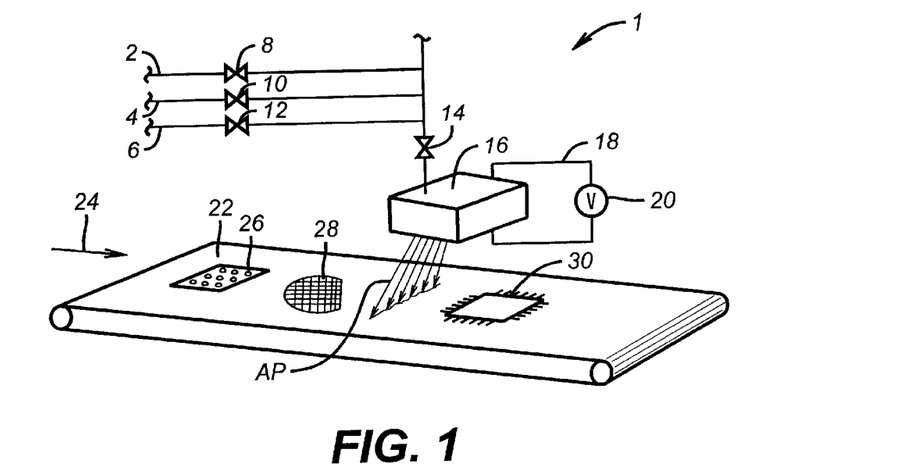
FIG. 1 is a schematic perspective view of a process in accordance with the present invention illustrating one treatment station, with different types of components being treated.

Referring now to the figures, FIG. 1 illustrates schematically a system 1 for carrying out methods of the present invention. System 1 includes an inert gas supply 2, an oxidizing gas supply 4, and a supply of reducing gas 6. One or all three gases may be used, depending upon the treatment desired. The three gases are supplied via valves 8, 10, and 12, respectively, and preferably flow through common valve 14 into an electrical discharge device 16. Electrical discharge device 16 contains two electrodes (not shown) which are charged via an electric circuit 18 and voltage source 20. Electrical discharge device produces an atmospheric pressure plasma represented as AP in FIGS. 1 and 2. As used herein, the term "atmospheric pressure" refers to a pressure ranging from about $0.1 \times 10^5$ Pa to about $3.0 \times 10^5$ Pa. FIG. 1 illustrates a conveyer or stepper 22 which moves in the direction of arrow 24, and therefore moves components 26, 28, and 30, through the atmospheric pressure plasma AP. Component 26 may be for example an array of metallic solder bumps on an IC, component 28 may be a semiconductor wafer having hundreds or thousands of metallic contacts on its surface, while component 30 may be any electrical component having a plurality of metallic electrical leads.

To maintain a pressure substantially near atmospheric pressure for the plasma, system 1 illustrated in FIG. 1, except for the gas supply conduits, is preferably enclosed within an air tight tunnel or hood, which is not illustrated in FIG. 1 for clarity purposes.

Figure 2:
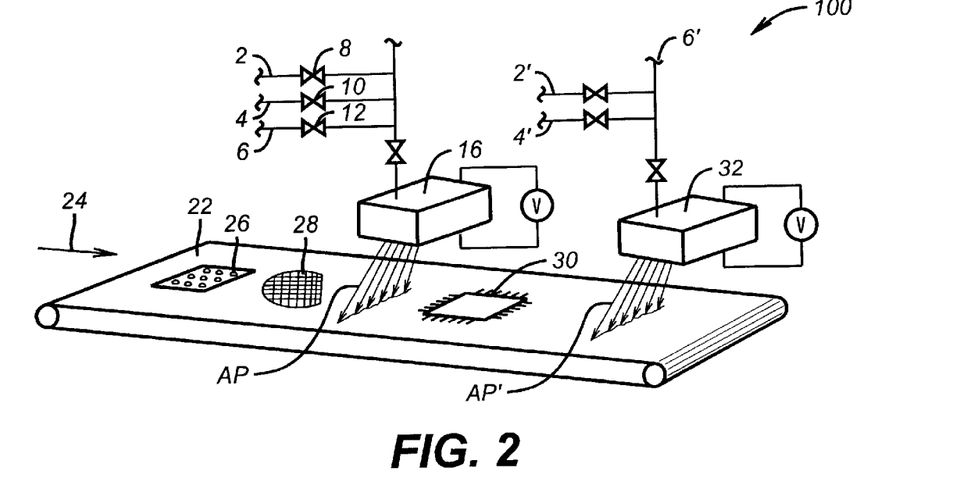
FIG. 2 is a schematic perspective view of a process in accordance with the present invention illustrating two treating stations in series.

Referring now to FIG. 2, FIG. 2 illustrates a system 100 similar to system 1 of FIG. 1 in that a conveyer 22 moves components 26, 28, and 30 through a first electrical discharge device 16, producing a first primary gas mixture comprising atmospheric plasma AP. FIG. 2 also illustrates a second electrical discharge device 32, producing a second atmospheric pressure plasma AP' primary gas mixture which may be the same or different from atmospheric pressure plasma AP. Thus FIG. 2 shows a series arrangement which may be effective for certain electrical component treatments, for example, where the components being treated have more than one type of metallic surface.

Figure 3:
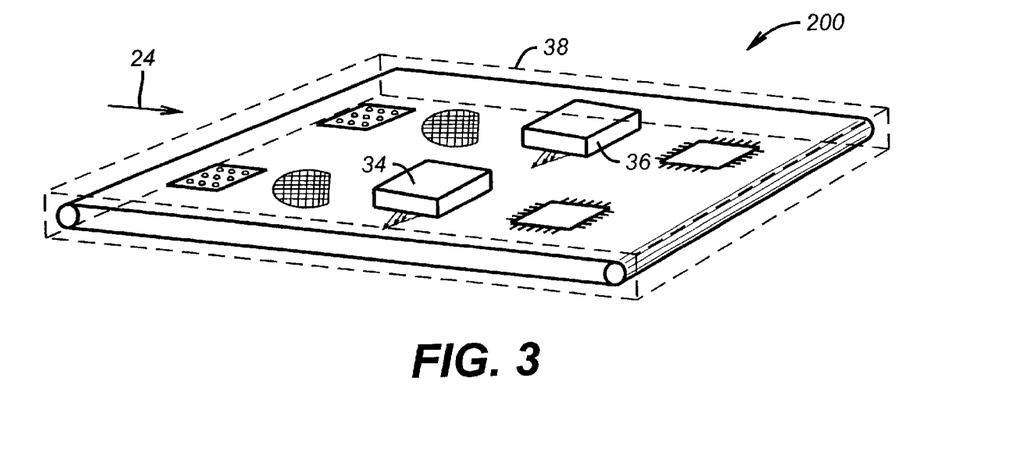
FIG. 3 is a schematic perspective view of a process and apparatus for parallel treating processes, plus illustrating a protective hood or tunnel in accordance with the present invention.

FIG. 3 illustrates schematically in an embodiment 200 where two electrical discharge apparatus 34 and 36 are arranged in parallel in relation to flow direction 24. FIG. 3 also illustrates schematically a hood or tunnel 38 (dotted lines). All other systems of the invention preferably have such hoods as well, which preferably functions to isolate AP and AP' from standard conditions. System 200 of FIG. 3 may be effective for high capacity treatment of same or different electrical components. The atmospheric pressure plasmas produced by electrical discharge units 34 and 36 may be the same or different by virtue of initial gases 2, 4, 6, 2', 4', and 6', as illustrated in FIG. 2.

Figure 4:
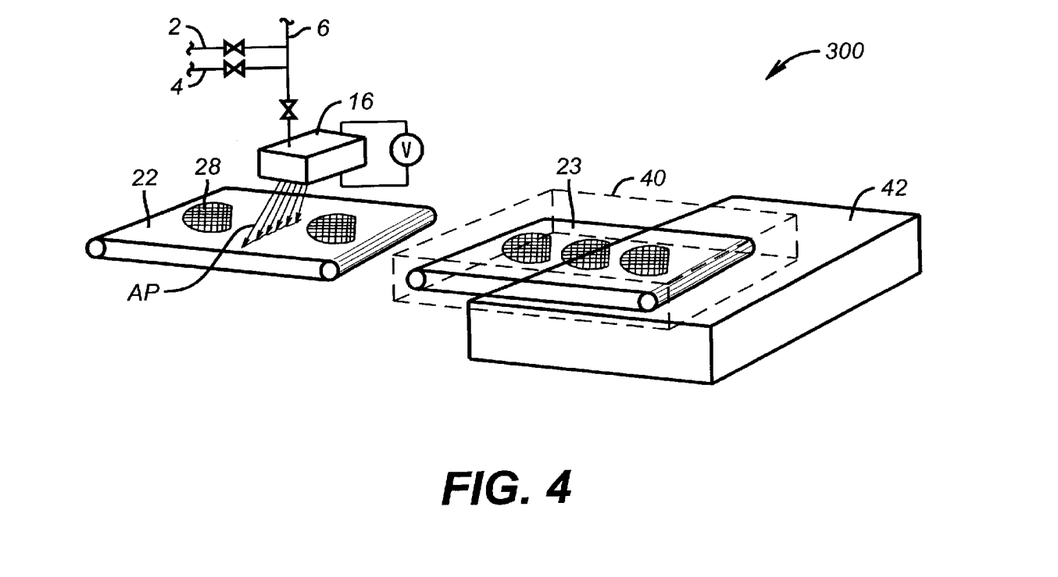
FIG. 4 is a schematic perspective view of a single treatment apparatus and including an inerting station prior to a bonding station.

Referring now to FIG. 4, system 300 includes a first sub-unit similar in respects to the system illustrated in FIG. 1, but further including a second conveyor or stepper 23 upon which components previously treated by plasma AP traverse on their way to a second treatment station characterized schematically as a box 42. Second treatment station 42 may be a bonding station for carrying out, for example, wire bonding, TAB bonding or solder bump bonding. System 300 as illustrated in FIG. 4 also preferably includes a hood 40 which may function to enclose an inert or other gas atmosphere. As used herein, the terms "protective" or "inert" atmosphere is defined as including no more than a few hundred ppm of oxygen, preferably no more than 100 ppm of oxygen.

Figure 5:
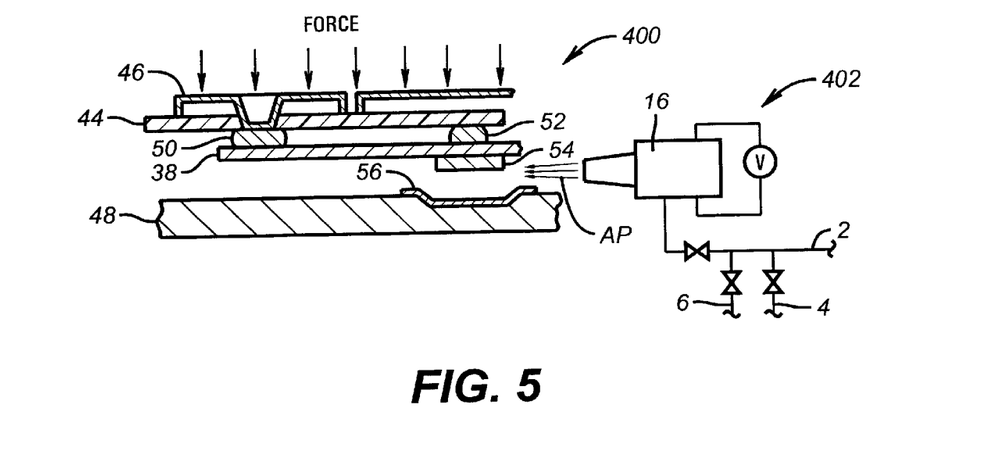
FIG. 5 illustrates schematically a cross-section view of an electrical component being treated with a primary gas in accordance with the present invention illustrating contacts, leads, and an interposer, prior to compression or ultrasonic or thermosonic bonding operation.
Figure 6:
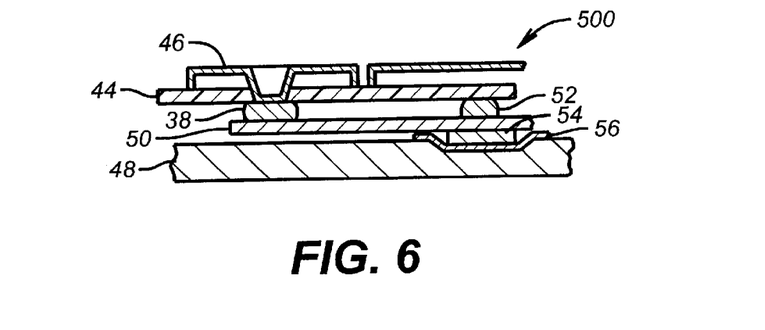
FIG. 6 illustrates schematically a finished bonded device after treatment and compression.

Referring now to FIGS. 5 and 6, FIG. 5 illustrates an electrical device 400 and system 402 for treatment of metallic surfaces therein just prior to a bonding operation. Illustrated in FIG. 5 is a flexible dielectric interposer element 44, a connection component 46 which is metallic, and an integrated circuit or semiconductor wafer 48. Also illustrated is a metallic lead 38 having first and second metallic connections 50 and 52 on one side of lead 38 and another metallic connection 54 on an underside of lead 38. Integrated circuit or semiconductor wafer 48 has a metallic lead or contact surface 56. One or more gases 2, 4, 6 enter electrical discharge device 16 and create a gaseous atmospheric pressure plasma AP comprising unstable or excited species which traverses across at least metallic components 54 and 56 just prior to compression bonding of the device to its completed structure 500 as illustrated in FIG. 6. Methods of making devices such as illustrated in FIGS. 5 and 6, except for the generation of an atmospheric pressure plasma primary gas comprising excited or unstable species, and treatment of metallic surfaces thereby, are disclosed in U.S. Pat. No. 5,518,964, which is incorporated by reference herein for the teaching of making such a device.

Figure 7:
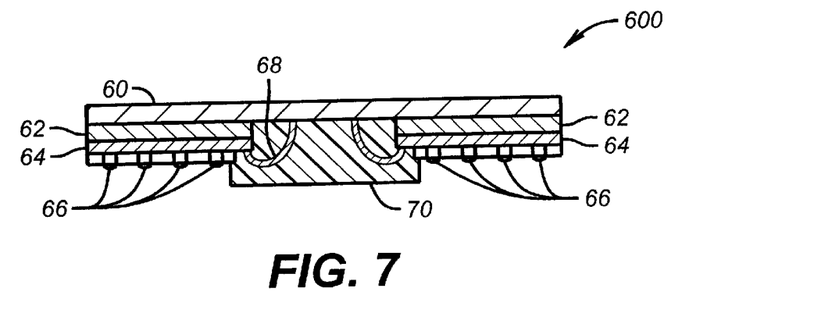
FIG. 7 is a cross-section elevation view of a typical wire bonded integrated circuit/substrate electronic component.

Referring now to FIG. 7, a wire bonded electronic device 600 exhibits a silicon die 60 having a film adhesive 62, such as silicone or other well known film adhesive attached thereto, in one layer which in turn attaches a TAB tape 64. TAB tape 64 has a plurality of metallic leads 66 which attach device 600 through a further bonding operation to a mother board (not shown). Device 600 includes wire bonds 68 which are encapsulated in a silicone or other encapsulant material.

Figure 8:
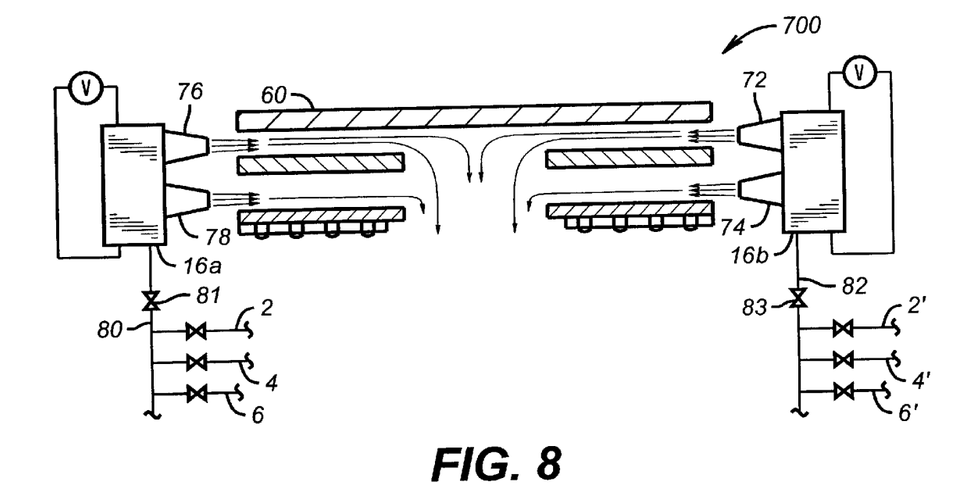
FIG. 8 illustrates in schematic two treatment stations illustrating conceptually where an atmospheric plasma may be applied to an integrated circuit surface and a TAB tape.

FIG. 8 illustrates an exploded view of device 600 of FIG. 7 as well as illustrating schematically dual systems for producing the atmospheric pressure plasma treatment primary gas. System 700 as illustrated in FIG. 8 illustrates two electrical discharge devices 16a and 16b. Electrical discharge device 16a, for example, admits an inert gas 2, an oxidizing gas 4, and/or a reducing gas 6 through tubing connection 80 and valve 81 into electrical discharge device 16a. Focusing nozzles 76 and 78 direct the atmospheric pressure plasma treatment across various surfaces (at least some of which comprise metal) of the various components prior to being molded or laminated. Similarly, gases entering tubing at 2', 4', and 6', enter through tubing 82 and valve 83 into electrical discharge device 16b, which produces an atmospheric pressure primary gas stream which flows through focusing nozzles 72 and 74.

Figure 9:
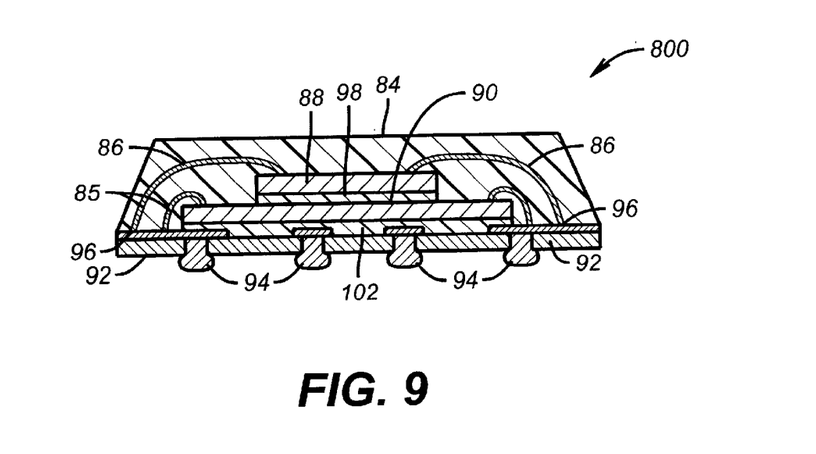
FIG. 9 is a schematic cross-section of a typical stacked chip design, the two chips wire bonded to a substrate.

Referring now to FIG. 9, electronic device 800 is an illustration of a stacked chip design wherein a first IC 88 is connected via wire bonds 85 and 86 to a substrate 92 having metal bonding regions 96. Metal bonding regions at 96 connect to terminals 94 which may further plug into a PCB board or mother board, again not illustrated. A second IC 90 is similarly connected via wire bonds 85 to metallic bonding regions 96. Terminals 94 protrude through a substrate 92, while a film adhesive 98 attaches IC 88 to IC 90, and a film adhesive 102 attaches IC 90 to substrate 92. Completing the device is an overmolded encapsulant as is known in the art, typically a silicone or polyimide polymeric material 84.

Figure 10:
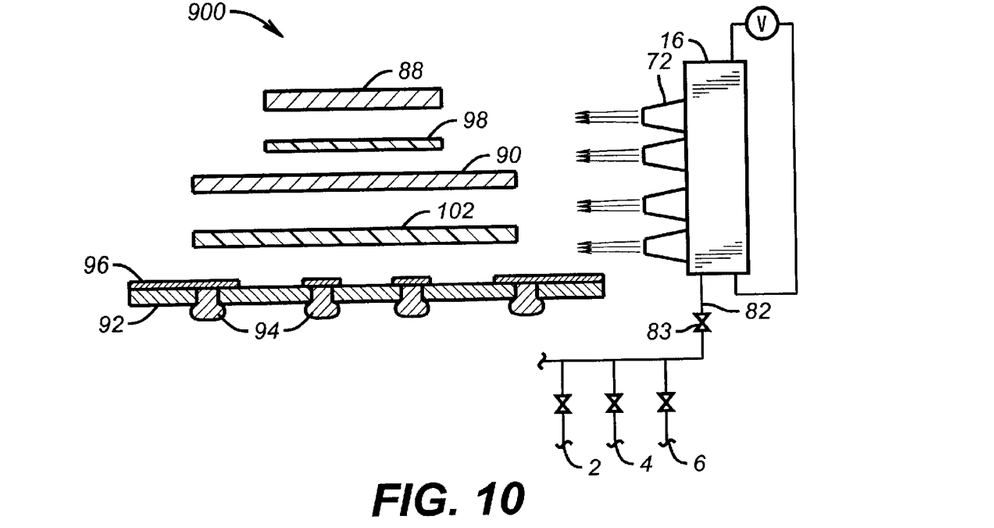
FIG. 10 illustrates schematically a treatment of two integrated circuits, and circuit board contacts plus polymer layers prior to wire bonding the device illustrated in FIG. 9.

As illustrated in FIG. 10 schematically, a system 900 for treatment of the various metallic bonding regions is an advantageous way to increase adhesion between various metallic bonding regions and other bonding regions prior to assembly of the stacked chip design illustrated in FIG. 9. As in previous systems of the present invention, supplies of an inert gas, an oxidizing gas, and/or a reducing gas enter through connections 2, 4, and 6, respectively, through a conduit 82 and valve 83 and further into electrical discharge device 16. Electrical discharge device 16 in the system of FIG. 10 includes a plurality of nozzles 72 which direct the atmospheric plasma primary gas across the various regions of subcomponents 88, 98, 90, 102, and 92, as well as metallic bonding regions 96. Terminals 94 may be similarly treated. The primary gas stream produced by electrical discharge device 16 preferentially removes unwanted metallic oxides as well as unwanted hydrocarbon greases or oils from the various metallic materials as well as from the IC circuits themselves.

Figure 11:
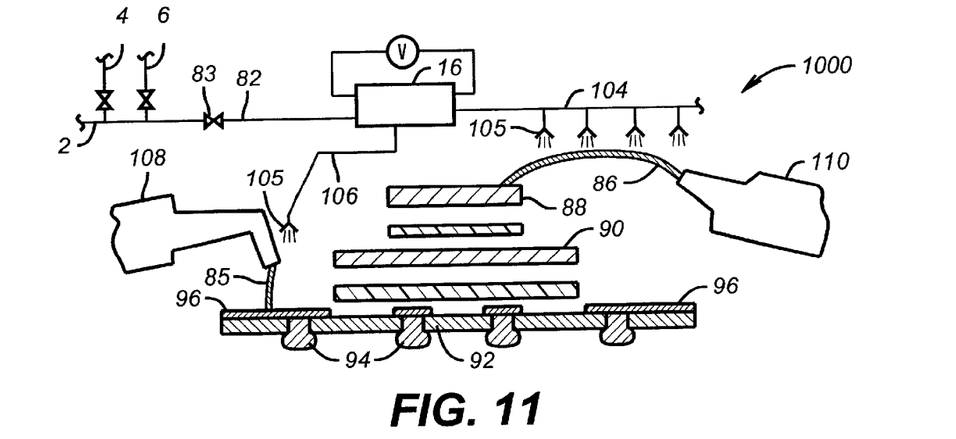
FIG. 11 is a schematic illustration of an atmospheric plasma treatment during wire bonding during production of the device illustrated in FIG. 9.

FIG. 11 illustrates a system 1000 for exposing a wire bonding operation to an atmospheric pressure plasma primary gas in accordance with a present invention. Initial gas enters into the system through conduit 82 and valve 83 and into an electrical discharge apparatus 16, producing a primary gas which is distributed in conduits 104 and 106. Conduits 104 and 106 preferably include one or more focusing nozzles 105 as indicated in FIG. 11 to direct the primary gas over and around metallic wires 85 and 86 as they are being attached to ICs 88 and 90 and the metallic bonding regions 96. System 1000 is advantageously used in a wire bonding operation, which is by far the most common bonding operation in the electronics industry today. Wire bonding operations typically use wire bonding machines 108 and 110 which are well known in the industry and need no further explanation herein to those of skill in the art.

Figure 12:
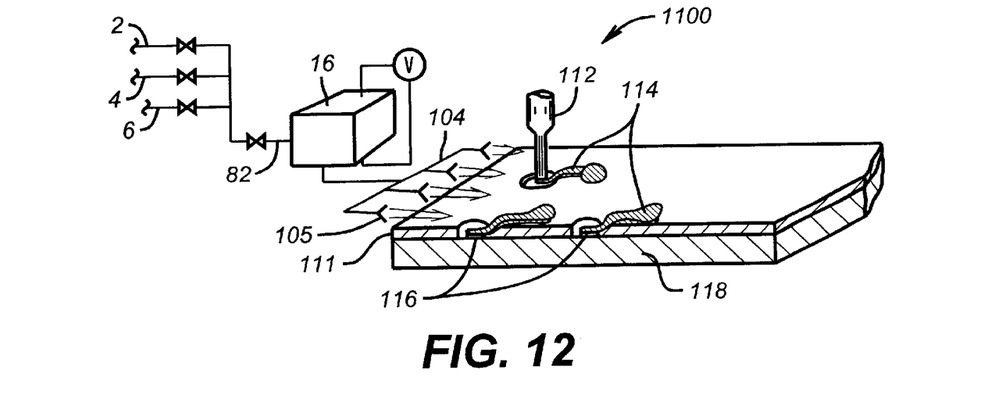
FIG. 12 illustrates schematically a single treatment station which may be used during a TAB bonding operation.

The system 1100 illustrated in FIG. 12 illustrates a system for treating an electronic component where a flexible interposer 111, typically in a form of a tape having a plurality of metallic leads 114 thereon is manipulated with a bonding tool 112. Bonding tool 112 connects metallic leads 114 with metallic contacts 116 on integrated circuit 118. Just prior to tool 112 approaching lead 114, system 1100 focuses a flowing stream of atmospheric pressure plasma through header 104 and nozzles 105 across leads 114 and metallic contacts 116. This system is effective in an operation as explained in U.S. Pat. No. 5,852,326, incorporated herein by reference for its teaching of use of a flexible interposer sheet 111 and tool 112. Flexible interposer sheet 111 is typically positioned in an electrical component between the integrated circuit 118 and a substrate (not shown). Leads 114 are contacted also with contact pads on a substrate which are metallic in nature and may also be treated with the gas flowing from system 1100 as illustrated in FIG. 12. For clarity, the substrate and its metallic contact pads are not shown.

Figure 13:
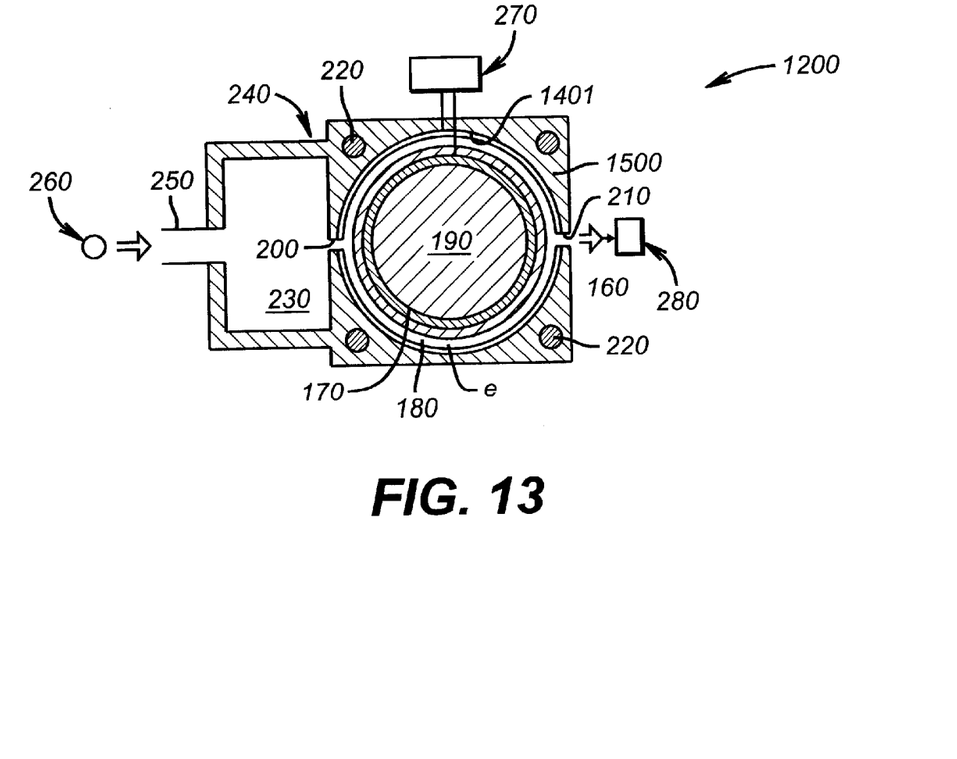
FIG. 13 represents a schematic view of a prior art atmospheric plasma apparatus which may be useful in practicing the present invention.

FIG. 13 illustrates a preferred electrical discharge apparatus 1200 useful in the practice of the methods and systems of the present invention. As represented in the embodiment of FIG. 13, one suitable apparatus 1200 is of cylindrical geometry and comprises a first tubular electrode 1401, formed for example by an internal face of a metallic block 1500, in which an assembly comprising a tube 160 of dielectric material, for example made of ceramic, is placed concentrically. A second electrode 170 whose thickness is exaggerated for clarity in FIG. 13 is deposited by metallization on the internal face of the dielectric tube.

The assembly comprising the dielectric 160 and the second electrode 170 thus bounds, with the first electrode 1401, a tubular gas passage 180 and, internally, an internal volume 190 in which a coolant is circulated, advantageously a Freon™ for its electronegative character or else deionized water. The internal gas passage 180 has an axial extent of less than 1 meter, typically less than 50 cm, and its radial thickness "e" does not exceed 3 mm and is typically less than 2.5 mm.

The block 1500 includes two diametrically opposite longitudinal slots 200 and 210 respectively forming the inlet for the initial gas to be excited in the passage 180 and the outlet for the primary gas flux containing the excited or unstable gas species.

The slots 200 and 210 extend over the entire axial length of the cavity 210 and have a width which, in the case of the embodiment represented in FIG. 13, does not exceed the thickness e and is typically substantially identical to the latter (other configurations could be envisioned, such as for example, a width slightly greater than the thickness e). The body 1500 advantageously includes, at the periphery of the first electrode 1401, a plurality of ducts 220 for passage of a coolant, for example, water. The gas inlet 200 communicates with a homogenization chamber or plenum 230 formed in a casing 240 attached to the block 1500 and including a tube 250 for supplying initial gas from an initial gas source 260 and therefore at a pressure which may vary, depending on the source, typically from a few bar to 100 or 200 bar. The electrodes 1401 and 170 are connected to a high-voltage and high-frequency electrical generator 270 operating at a frequency advantageously greater than 15 kHz and delivering a power of, for example, the order of 10 kW. It may furthermore be advantageous to express this power delivered by the generator by normalizing it per unit surface area of dielectric.

Figure 14:
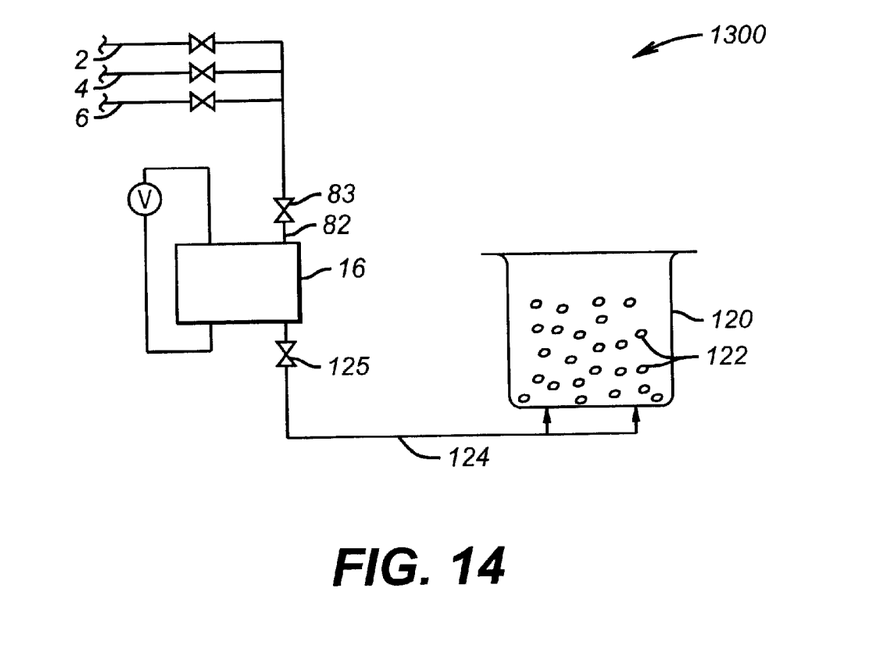
FIG. 14 is a schematic illustration of treatment of loose solder pellets in accordance with the present application.

FIG. 14 illustrates a system 1300 which may be useful in treating metallic solder pellets 122 contained in a container 120. System 1300 is similar in some respects to previous systems of the invention wherein gases 2, 4, and 6, enter as an initial gas through a conduit 82 and valve 83 into an electrical discharge apparatus 16. A conduit 124 and valve 125 allows primary gas produced by electrical discharge device 16 to flow up and into container 120 thereby creating a primary gas treatment atmosphere for solder pellets 122. Solder pellets 122 may be stationary, with primary gas flowing around the pellets, or may exist as a fluidized bed, depending on the flow rate of primary gas through conduit 124, the size, weight and shape of the solder pellets, and the desired turbulence in container 120. Solder pellets 122 are preferably spherical in shape, but may be almost any shape, such as square or oblong ellipsoid. Most preferably, they are spherical balls.

Figure 15:
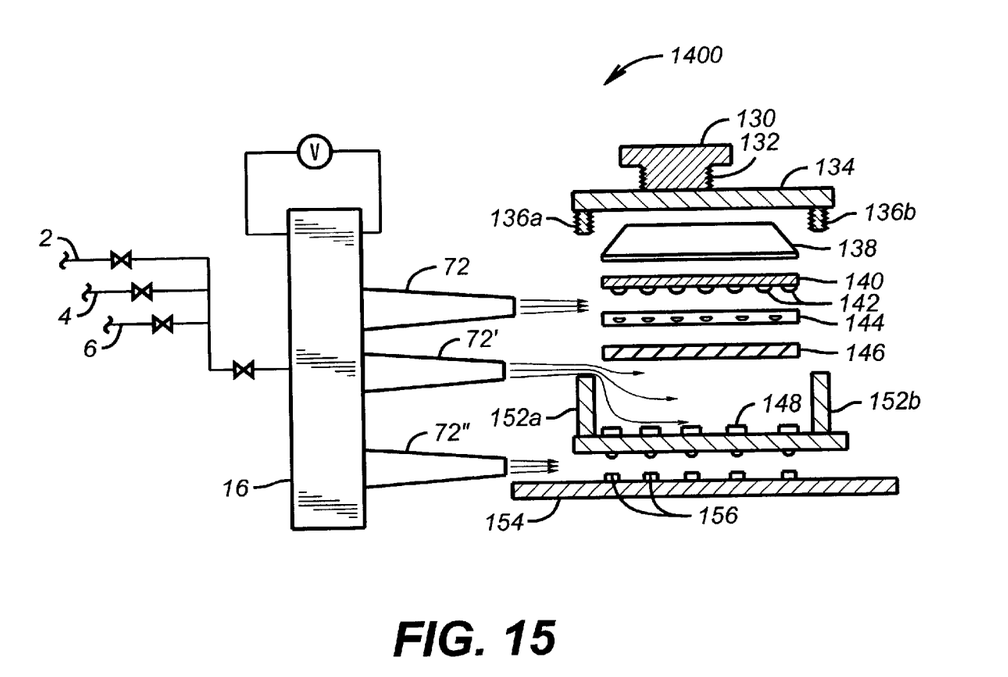
FIG. 15 is a schematic illustration of treatment of various components of a socket component for test and burn-in of integrated circuits.

FIG. 15 illustrates a system 1400 for treatment of various components of a BGA socket testing device. The exploded view in FIG. 15 illustrates a heat sink screw 130 having threads 132, and a socket lid 134. Socket lid 134 in turn supports machine screws 136a and 136b which in turn connect with a base assembly 150 through connection conduits 152a and 152b. A compression plate 138 is used to compress a BGA package 140 having solder balls 142 therein. An alignment plate 144 as is known in the art is used to align solder balls 142 and a z-axis flexible interposer 146 is used in the compression and testing of the BGA package. Completing the assembly are metallic terminals 148 which electrically connect with metallic terminals 156 on a target PCB with SMT pads 154. These type of sockets are designed so that force is evenly distributed on the top of the integrated circuit of the BGA package, pushing solder balls 142 into a very high speed, z-axis, elastomer connection medium. Heat sink screw 130 and socket lid 134 provide heat dissipation for the device in the socket. Precision guides for the IC body and solder balls position the device for a perfect connection. Elastomer interposer 146 is preferably a z-axis conductive elastomer having low resistance (less than 0.01 Ohm). The elastomer consists of multiple rows of metal filaments arranged symmetrically in a sheet of soft silicone rubber. The insulation resistance between connections with 500 VDC is 1000 megaohms, making it ideal for high-current (50 milliamp per filament) applications where a thin, high-density, anisotropic connector is required. Further information may be obtained in the article *"Using Conductive Elastomer Sockets for High-Speed Chip-Scale Packages,"* Chip-Scale Review Magazine, September/October 2000, pp. 71–75, incorporated herein by reference. System 1400, as other systems of the present invention, includes gas connections 2, 4, 6, electrical discharge apparatus 16, and focusing nozzle 72, 72', and 72". Nozzles 72, 72' and 72" direct flow of primary gas produced by electrical discharge apparatus 16 across various metal surfaces, enhancing metal to metal contact during test and burn-in of BGA packages as illustrated in FIG. 15.

Contrary to other applications, concentration of water vapor in the initial gas mixture as used in the present invention is preferably kept very low as explained herein, so as to avoid species that can recombine to form water on surfaces exposed to the plasma. If the initial gas contained more than even 1 ppb moisture, the result of passing the initial gas through the high voltage electrical discharge apparatus would disadvantageously create a plurality of unstable O species and unstable H species which might recombine to form water and lead to the popcorn effect. The atmospheric pressure plasma of the present invention near the treatment zone (primary gas) will have a low oxygen concentration, preferably less than 50 ppm, preferably less than 30 ppm, and more preferably from about 5 to 30 ppm, in order to insure a good treatment.

Although specific preferred embodiments have been described herein, those skilled in the electronics packaging art will recognize other embodiments, which the inventors herein maintain are within the scope of the appended claims.

What is claimed is:

1. A system for effecting bond region modification in electronic components comprising encapsulant materials, the system comprising:
    (a) a sub-system in which one or more electronic components are adapted to have an encapsulant applied and bonded thereto;
    (b) a source of initial gas; and
    (c) an electrical discharge apparatus connected to said source of initial gas for producing a primary gas from said initial gas, the primary gas comprising a plurality of unstable or excited species, the primary gas adapted to contact at least a portion of encapsulant bond regions of the electrical components in the sub-system and thereby effect encapsulant bond region modification prior to encapsulation.

2. System in accordance with claim 1 wherein said source of initial gas comprises a source of an inert gas.

3. System in accordance with claim 2 wherein said source of initial gas comprises a source of a reducing gas.

4. System in accordance with claim 3 wherein said source of initial gas comprises a source of an oxidizing gas.

5. System in accordance with claim 4 comprising means to supply said initial gas having no more than 1% water vapor.

6. System in accordance with claim 1 comprising means to maintain the primary gas mixture at a pressure ranging from about $0.1 \times 10^5$ Pa to about $3.0 \times 10^5$ Pa.

7. System in accordance with claim 1 which includes at least two electrical discharge apparatus.

8. System in accordance with claim 7 wherein two of the electrical discharge apparatus are in series.

9. System in accordance with claim 7 wherein two of the electrical discharge apparatus are in parallel.

10. System in accordance with claim 1 which includes a hood which encloses the sub-system.

11. A system for encapsulating one or more bonded metallic bond regions of a first electronic component bonded to one or more metallic bond regions of a second electronic component to form one or more metallic bonded regions, the system comprising:
    (a) a conveying sub-system upon which one or more metallically bonded, non-encapsulated electronic components travel from a metallic bonding station, electronic components having at least one metallic bond region;
    (b) a source of initial gas;
    (c) an electrical discharge apparatus for producing a primary gas from said initial gas, the primary gas comprising a plurality of unstable or excited species, the primary gas adapted to contact at least some of regions of the electrical components adapted to be encapsulated and thereby effect encapsulant bond region modification; and
    (d) an encapsulation station downstream of the bonding station, wherein the metallic bonded, non-encapsulated electrical components are encapsulated.

12. System in accordance with claim 11 wherein the conveying sub-system comprises means to maintain the primary gas at a pressure ranging from about $0.1 \times 10^5$ Pa to about $3.0 \times 10^5$ Pa.

13. System in accordance with claim 11 wherein the source of initial gas comprises a source of an inert gas.

14. System in accordance with claim 13 wherein the source of initial gas comprises a source of a reducing gas.

15. System in accordance with claim 14 wherein the source of initial gas comprises a source of an oxidizing gas.

* * * * *